(12) United States Patent
Kim

(10) Patent No.: US 10,121,621 B2
(45) Date of Patent: Nov. 6, 2018

(54) CONTROLLER FOR CONFIRMING CONTACT STATUS AND CONTROLLING CONTACT OF LATCH RELAY IN ELECTRIC POWER METER

(71) Applicant: LSIS CO., LTD., Anyang-si, Gyeonggi-do (JP)

(72) Inventor: Hyungkyu Kim, Anyang-si (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 305 days.

(21) Appl. No.: 15/057,377

(22) Filed: Mar. 1, 2016

(65) Prior Publication Data

US 2016/0268079 A1    Sep. 15, 2016

(30) Foreign Application Priority Data

Mar. 12, 2015   (KR) .................. 10-2015-0034585

(51) Int. Cl.
*H01H 47/00* (2006.01)
*G01R 31/327* (2006.01)
(Continued)

(52) U.S. Cl.
CPC ......... *H01H 47/001* (2013.01); *G01R 31/327* (2013.01); *H01H 50/08* (2013.01);
(Continued)

(58) Field of Classification Search
USPC ................................. 361/139, 160
See application file for complete search history.

(56) References Cited

U.S. PATENT DOCUMENTS

2006/0087782 A1* 4/2006 Michalko ............... H02H 3/04
361/62
2011/0228438 A1* 9/2011 Kohri ................... H01H 1/0015
361/187

FOREIGN PATENT DOCUMENTS

CN    2043363 U    8/1989
CN    101154108 A    4/2008
(Continued)

OTHER PUBLICATIONS

European Patent Office Application Serial No. 16158163.2, Search Report dated Sep. 13, 2016, 10 pages.
(Continued)

*Primary Examiner* — Danny Nguyen
(74) *Attorney, Agent, or Firm* — K&L Gates LLP

(57) ABSTRACT

A controller for confirming the contact status of a latch relay embedded in an electric power meter according to the invention includes a microcomputer unit that is electrically connected to the latch relay for reading and providing the contact switching status information of the latch relay during a power failure, and read the contact switching status information stored during the power failure when a power recovers, and configured to output an opening control signal to the latch relay when the read contact switching status is an open state, and configured to output a closing control signal to the latch relay when the read contact switching status is a closed state; and a non-volatile memory that stores the contact switching status information of the latch relay provided by the microcomputer unit or provides the contact switching status information of the latch relay to the microcomputer unit during a power failure.

7 Claims, 3 Drawing Sheets

(51) Int. Cl.
*H01H 50/08* (2006.01)
*G01R 21/133* (2006.01)
*H01H 9/16* (2006.01)

(52) U.S. Cl.
CPC ........... *G01R 21/133* (2013.01); *H01H 9/167* (2013.01); *H01H 47/002* (2013.01)

(56) References Cited

FOREIGN PATENT DOCUMENTS

| | | |
|---|---|---|
| CN | 101399134 A | 4/2009 |
| CN | 101625939 A | 1/2010 |
| EP | 2695762 | 2/2014 |
| JP | 04-102127 | 9/1992 |
| JP | 08-126075 | 5/1996 |
| JP | 2000010874 | 1/2000 |
| JP | 2002008511 | 1/2002 |
| JP | 2003-43076 | 2/2003 |
| KR | 101017761 | 2/2011 |

OTHER PUBLICATIONS

Chinese Office Action for related Chinese Application No. 201610144737.X; action dated Apr. 2, 2018; (6 pages).

\* cited by examiner

CONTROLLER FOR CONFIRMING CONTACT STATUS AND CONTROLLING CONTACT OF LATCH RELAY IN ELECTRIC POWER METER

CROSS-REFERENCE TO RELATED APPLICATIONS

Pursuant to 35 U.S.C. § 119 (a), this application claims the benefit of earlier filing date and right of priority to Korean Application No. 10-2015-0034585, filed on Mar. 12, 2015, the contents of which are all hereby incorporated by reference herein in its entirety.

BACKGROUND OF THE INVENTION

1. Field of the Invention

The present disclosure relates to a controller for confirming the contact status of a latch relay in an electric power meter.

2. Description of the Related Art

Latch relay embedded in a digital electric power meter or smart meter as a switch device capable of switching at least one of lines for supplying electric power to the side of an electric load from the side of an electric power source maintains the open or closed status once the opening or closing of a contact has been made.

For an example of such a digital electric power meter and a latch relay according to the related art, the following patent literature disclosed by the applicant of the present disclosure is described below for reference.

(Patent Document 1) KR10-1017761 B1

However, a digital electric power meter embedded with a latch relay according to the related art uses a method of determining the contact switching status according to stored history data on the contact switching status of a latch relay, namely, previous contact switching status information stored in the memory other than a method of directly sensing the contact switching status information of a latch relay to recognize the contact switching status thereof.

Accordingly, when a digital electric power meter is moved for a new installation or separated from the existing installation location and then reinstalled for repair, the stored previous contact switching status information of a latch relay may be different from the real contact switching status of the latch relay due to a mechanical shock or vibration, thus causing a problem of inducing an electrical safety accident.

SUMMARY OF THE INVENTION

Accordingly, the present disclosure is contrived to solve the problem in the related art, and an object of the present disclosure is to provide a controller for confirming the contact status of a latch relay embedded in an electric power meter capable of performing a status confirmation (reconfirm) operation on the contact switching of an embedded latch relay in an electric power meter, thereby preventing an electrical safety accident even though the contact status of the latch relay changes due to vibration, shock or the like.

Another object of the present disclosure is to provide a controller for confirming the contact status of a latch relay embedded in an electric power meter capable of directly detecting the contact switching status of a latch relay embedded in an electric power meter to correctly detect the contact switching status of the embedded latch relay even though the contact status of the latch relay changes due to vibration, shock or the like, thereby preventing an electrical safety accident.

The foregoing, an object of the present disclosure may be accomplished by providing a controller for confirming the contact status of a latch relay embedded in an electric power meter, comprising:

a microcomputer unit that is electrically connected to the latch relay for reading and providing the contact switching status information of the latch relay to store when a power failure occurs, and read the contact switching status information stored during the power failure when a power recovers, and configured to output an opening control signal to the latch relay when the read contact switching status is an open state, and configured to output a closing control signal to the latch relay when the read contact switching status is a closed state; and a non-volatile memory that stores the contact switching status information of the latch relay provided by the microcomputer unit or provides the contact switching status information of the latch relay to the microcomputer unit during a power failure.

The foregoing, another object of the present disclosure may be accomplished by providing a controller for confirming the contact status of a latch relay embedded in an electric power meter, wherein the microcomputer unit is configured to sense an input voltage and an output voltage of the embedded latch relay when a power recovers or in a state that the electric power meter is separated from a normal installation location and then reinstalled and an electric power is supplied again to the electric power meter, configured to determine the contact of the embedded latch relay as a closed state when the sensed input voltage of the embedded latch relay is substantially the same as the output voltage thereof, and configured to determine the contact of the embedded latch relay as an open state when there exists the input voltage input but does not exist the output voltage input.

According to a preferred aspect of the present disclosure, the microcomputer unit is configured to output an opening control signal to the latch relay when the stored contact switching status information represents an open state, and outputs a closing control signal to the latch relay when the stored contact switching status information represents a closed state according to the sensed contact switching status information.

According to another preferred aspect of the present disclosure, the microcomputer unit is configured to output an opening control signal to the latch relay when the sensed contact switching status information is an open state, and configured to output a closing control signal to the latch relay when the sensed contact switching status information is a closed state according to the contact switching status information read from the non-volatile memory during a power failure According to still another preferred aspect of the present disclosure, the controller further comprises a voltage detection device connected to an input terminal and an output terminal of the embedded latch relay, respectively, to detect the input voltage and output voltage of the embedded latch relay.

According to still another preferred aspect of the present disclosure, the voltage detection device is configured with a voltage dividing resistor connected to an input terminal and an output terminal of the embedded latch relay, respectively.

According to yet still another preferred aspect of the present disclosure, the voltage detection device is configured with a potential transformer connected to an input terminal and an output terminal of the embedded latch relay, respectively.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

The objective of the present invention, as well as the configuration and working effect thereof to accomplish the foregoing objective will be more clearly understood by the following description for the preferred embodiments of present disclosure with reference to the accompanying drawings.

Figure 1:
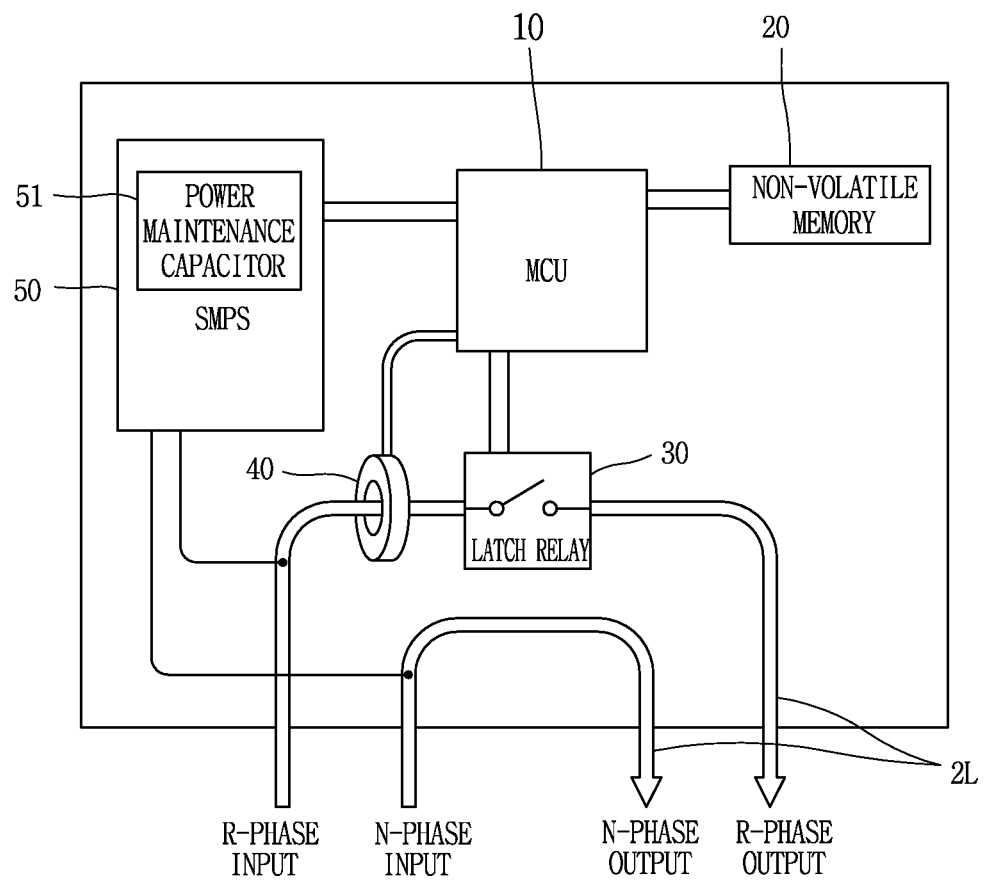
FIG. 1 is a block diagram illustrating the configuration of an electric power meter having a controller for confirming the contact status of a latch relay according to a preferred embodiment of the present disclosure.

Referring to FIG. 1 which is a block diagram illustrating the configuration of an electric power meter having a controller for confirming the contact status of a latch relay according to a preferred embodiment of the present disclosure, the controller for confirming the contact status of a latch relay embedded in an electric power meter according to a preferred embodiment of the present disclosure comprises a microcomputer unit 10 and a non-volatile memory 20.

The microcomputer unit 10 basically performs a function of measuring an amount of an electric power usage within an electric power meter 100.

Furthermore, the microcomputer unit 10 is electrically connected to the latch relay to read, provide for storing the contact switching status information of the latch relay 30 during a power failure or in a state that the electric power meter 100 is separated from a normal installation location according to the feature of the present disclosure (in other words, writes the contact switching status information into the non-volatile memory 20).

Furthermore, the microcomputer unit 10 reads the stored contact switching status information during the power failure or in a state that the electric power meter 100 was separated from the normal installation location from the non-volatile memory 20 when the electric power (abbreviated as "power" hereinafter) recovers or in the state that the electric power meter is installed at a normal installation location and power is supplied to the electric power meter.

According to the read contact switching status information, the microcomputer unit 10 may be configured to output an opening control signal to the latch relay 30 when the read contact switching status is an open state, and output a closing control signal to the latch relay 30 when the read contact switching status is a closed state. In other words, according to a processing program stored in a program storage memory included in the microcomputer unit 10, the microcomputer unit 10 may output an opening control signal to the latch relay 30 when the store contact switching status is an open state, and output a closing control signal to the latch relay 30 when the stored contact switching status is a closed state.

The non-volatile memory 20 may be electrically connected to the microcomputer unit 10 to store the contact switching status information of the latch relay 30 provided by the microcomputer unit 10. The non-volatile memory 20 may be configured with a flash memory or the like to read and write information as well as memorize the stored information even when power supply is discontinued.

Furthermore, the non-volatile memory 20 may provide the contact switching status information of the latch relay 30 to the microcomputer unit 10 during a power failure or in a state that the electric power meter 100 is separated from a normal installation location.

In FIG. 1, the electric power meter 100 further comprises a switching mode power supply (abbreviated as "SMPS") for DC power supply, and the switching mode power supply 50 is connected to a supply line (2L) of AC power to convert an AC current flowing through the supply line (2L) into a DC current, and stabilize it into constant DC small voltages required for digital components so as to supply them to the microcomputer unit 10, the non-volatile memory 20, and the like.

Furthermore, the switching mode power supply 50 further comprise a power maintenance capacitor 51 capable of supplying DC power for one second, for instance, during power supply discontinuation such as a power failure.

In FIG. 1, the electric power meter 100 may further comprise a current transformer 40 for current measurement.

A controller for confirming the contact status of a latch relay embedded in an electric power meter according to the present disclosure may be configured to directly detect the switching status of the embedded latch relay according to another preferred embodiment of the present disclosure without recognizing the switching status of the embedded latch relay depending on the contact switching status information provided by the non-volatile memory 20 as shown in the to foregoing embodiment.

In other words, in a controller for confirming the contact status of a latch relay embedded in an electric power meter according to another preferred embodiment of the present disclosure, the microcomputer unit 10 may be configured to sense an input and an output voltage of the embedded latch relay 30 when the power recovers subsequent to a power failure or in a state that the electric power meter was separated from a normal installation location and then the electric power meter is reinstalled at the normal installation location and power is supplied to the electric power meter. And the microcomputer unit 10 is configured to determine the contact of the embedded latch relay as a closed state when the sensed input voltage of the embedded latch relay is substantially the same as the output voltage thereof, and determine the contact of the embedded latch relay as an open state when there exists the input voltage input but does not exist the output voltage input.

In other words, according to a processing program stored in a program storage memory included in the microcomputer unit 10, the input voltage and output voltage of the embedded latch relay 30 may be sensed to determine the contact of the embedded latch relay as a closed state when the sensed input voltage of the embedded latch relay is substantially the same as the output voltage thereof, and determine the contact of the embedded latch relay as an open state when there exists the input voltage input but does not exist the output voltage input.

In a controller for confirming the contact status of a latch relay embedded in an electric power meter according to another preferred embodiment of the present disclosure, the microcomputer unit 10 may be configured to output an opening control signal to the latch relay when the sensed contact switching status information is an open state, and output a closing control signal to the latch relay when the sensed contact switching status information is a closed state. In other words, according to a processing program stored in a program storage memory included in the microcomputer unit 10, the microcomputer unit 10 may output an opening control signal to the latch relay when the sensed contact switching status information is an open state, and output a closing control signal to the latch relay when the sensed contact switching status information is a closed state.

Figure 2:
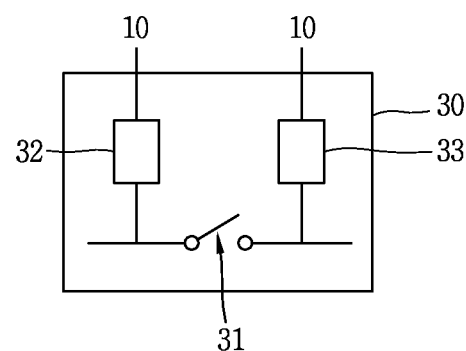
FIG. 2 is a block diagram illustrating the configuration of a voltage detection device for detecting an input/output voltage of a latch relay according to another preferred embodiment of the present disclosure.

A controller for confirming the contact status of a latch relay embedded in an electric power meter according to another preferred embodiment of the present disclosure may further comprise a voltage detection device 32 connected to an input terminal of the embedded latch relay 30 and a voltage detection device 33 connected to an output terminal thereof, respectively, to detect the input voltage and output voltage of the embedded latch relay 30 with reference to FIG. 2.

According to a preferred embodiment of the present disclosure, the voltage detection devices 32, 33 may be configured with a voltage dividing resistors (in other words shunt resistors) connected to an input terminal and an output terminal of the embedded latch relay 30, respectively.

According to another embodiment of the present disclosure, the voltage detection devices 32, 33 may be configured with a potential transformer connected to an input terminal and an output terminal of the embedded latch relay 30, respectively.

In FIG. 2, reference numeral 31 designates a switching contact of the latch relay 30.

Figure 3:
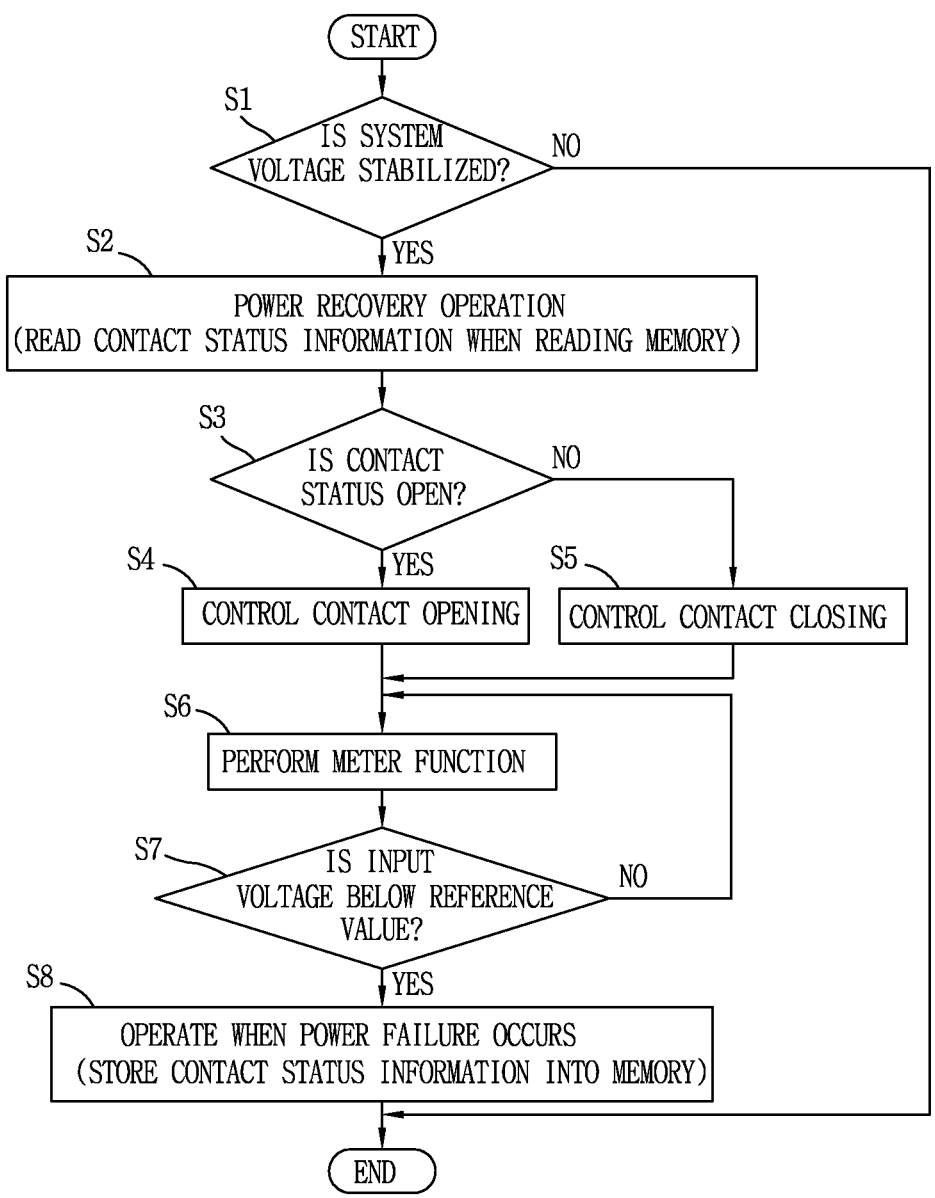
FIG. 3 is a flow chart illustrating the operation of a controller for confirming the contact status of a latch relay embedded in an electric power meter according to a preferred embodiment of the present disclosure.

On the other hand, the operation of a controller for confirming the contact status of a latch relay embedded in an electric power meter according to a preferred embodiment of the present disclosure will be described, mainly with reference to FIG. 3, which is a flow chart illustrating the operation of a controller for confirming the contact status of a latch relay embedded in an electric power meter according to a preferred embodiment of the present disclosure, and supplementarily with reference to FIGS. 1 and 2.

First, the microcomputer unit 10 checks whether or not the voltage of a system is stabilized (step S1). Here, the system may be interpreted to denote the electric power meter 100, and the system voltage may be interpreted to denote a commercial AC voltage, for instance, AC 220V, and whether or not the system voltage is stabilized may be interpreted to denote whether or not the commercial AC voltage is normally supplied to the electric power meter 100.

The detection of the commercial AC voltage may be made by the microcomputer unit 10 based on a voltage detection signal provided by a device (not shown) for detecting the commercial AC voltage embedded in the electric power meter 100 to measure electric power.

During step S1, the system voltage being stabilized may be interpreted to denote a state in which a normal commercial AC voltage is supplied to the electric power meter 100 after a power recovery subsequent to a power failure or reinstallation subsequent to repair or the electric power meter 100 is newly installed.

During step S1, when the system voltage is stabilized, namely, when it is determined by the microcomputer unit 10 that a normal commercial AC voltage is supplied to the electric power meter 100, it proceeds to the step S2.

During step S1, when the system voltage is not stabilized, namely, when it is determined by the microcomputer unit 10 that a normal commercial AC voltage is not supplied to the electric power meter 100 in a state that reinstallation is incomplete subsequent to the separation of the electric power meter 100 for repair or the new installation of the electric power meter 100 is incomplete, the microcomputer unit 10 discontinues a control operation of confirming the contact switching status of the embedded latch relay in a controller for confirming the contact status of a latch relay embedded in an electric power meter according to the present embodiment.

During step S2, the microcomputer unit 10 reads (reads out) information representing the last stored contact status information of the latch relay 30, namely, whether the contact is in an open or closed state, from the non-volatile memory 20.

During step S2, the operation of reading information indicating the last stored contact status information of the latch relay 30 from the non-volatile memory 20 can be substituted with an operation of directly receiving the input voltage and output voltage of the latch relay detected from the voltage detection devices 32, 33 connected to an input terminal and an output terminal of the latch relay 30, respectively.

During the next step S3, the microcomputer unit 10 determines whether or not the contact status of the latch relay 30 is in an open state.

During step S3, a method of allowing the microcomputer unit 10 to determine whether or not the contact status of the latch relay 30 is in an open state is a method of determining it based on the last stored contact status information of the latch relay 30 from the non-volatile memory 20 according to a preferred embodiment of the present disclosure. In other words, when the last stored contact switching status information of the latch relay 30 provided by the non-volatile memory 20 is a contact open state, it is determined that a current contact status is an open state.

During step S3, another method of allowing the microcomputer unit 10 to determine whether or not the contact status of the latch relay 30 is in an open state is a method of comparing the input voltage and output voltage of the latch relay detected from the voltage detection devices 32, 33 connected to an input terminal and an output terminal of the latch relay 30 on whether or not they are substantially the same. When the input voltage and output voltage of the latch relay provided by the voltage detection devices 32, 33 are substantially the same, the microcomputer unit 10 determines the contact status of the latch relay 30 as a currently closed state, and when the input voltage and output voltage of the latch relay provided by the voltage detection devices 32, 33 are substantially different, the microcomputer unit 10 determines the contact status of the latch relay 30 as a currently open state.

During step S3, when the contact status of the latch relay 30 is in a currently open state, the microcomputer unit 10 controls the latch relay 30 to securely open the contact the latch relay 30 to perform a confirmation (reconfirm) operation of the contact status (step S4).

During step S3, when the contact status of the latch relay 30 is in a currently closed state, the microcomputer unit 10 controls the latch relay 30 to securely close the contact the latch relay 30 to perform a confirmation (reconfirm) operation of the contact status (step S5).

During the next step S6, the microcomputer unit 10 performs a meter function which is a basic function of the electric power meter 100, namely, a function of measuring amount of electric power usage and metering electric power. Such a basic function denotes a function including an operation of multiplying a current value detected by the transformer 40 for current measurement and a voltage value provided from the detection device of a commercial AC voltage (not shown) to calculate electric power, and accumulating the relevant electric power according to the passage of time to calculate an amount of electricity used.

Then, during step S7, the microcomputer unit 10 determines whether or not an input voltage detected by the detection device (not shown) of a commercial AC voltage, namely, commercial AC voltage, is below a reference voltage for determining the occurrence of a power failure.

During step S7, when the commercial AC voltage is below a reference voltage for determining the occurrence of the power failure, the microcomputer unit 10 writes the contact status information of the latch relay 30 into the non-volatile memory 20 (step S8) to store. At this time, the contact status information of the latch relay 30 as contact status information according to a control output at which the microcomputer unit 10 has previously controlled the contact status of the latch relay 30 may be information stored in a memory device such as RAM, for instance, included in the microcomputer unit 10 and then provided to the microcomputer unit 10.

During step S7, when the commercial AC voltage is not below a reference voltage for determining the occurrence of a power failure, namely, when the commercial AC voltage is a normal voltage, the microcomputer unit 10 is returned to step S6 to perform a meter function which is a basic function of the electric power meter 100.

As described above, a controller for confirming the contact status of a latch relay embedded in an electric power meter according to the present disclosure may output a control signal for reconfirming once more with a switching status such as contact switching status information stored in the non-volatile memory to perform a confirmation (reconfirm) operation on an open or closed state of the embedded latch relay, thereby providing an effect capable of is preventing the occurrence of an electrical safety accident according to a switching status error even when the contact of the latch relay embedded in the electric power meter varies due to shock, vibration or the like.

As described above, a controller for confirming the contact status of a latch relay embedded in an electric power meter according to the present embodiment may be configured to directly read the input voltage and output voltage of the embedded latch relay to determine an open or closed state of the latch relay, thereby providing an effect capable of preventing the occurrence of an electrical safety accident according to a switching status error of the latch relay embedded in the electric power meter even when the contact of the latch relay embedded in the electric power meter varies due to shock, vibration or the like.

A controller for confirming the contact status of a latch relay embedded in an electric power meter according to the present embodiment may include a microcomputer unit configured to read contact switching status information stored during a power failure or in a state that the electric power meter is separated from a normal installation location, and output a control signal for opening or closing the contact status of the latch relay with the same switching status according to the read contact switching status information, and output a control signal for reconfirming once more with a switching status such as the read contact switching status to perform a reconfirm operation on an open or closed state of the embedded latch relay even when the read contact switching status information is different from the actual contact switching status of the embedded latch relay, thereby providing an effect capable of preventing the occurrence of an electrical safety accident according to a switching status error of the latch relay embedded in the electric power meter.

A controller for confirming the contact status of a latch relay embedded in an electric power meter according to the present disclosure may include a microcomputer unit configured to sense an input voltage and an output voltage of the latch relay, and determine the contact of the embedded latch relay as a closed state when the sensed input voltage of the embedded latch relay is substantially the same as the output voltage thereof, and determine the contact of the embedded latch relay as an open state when there exists the input voltage input but does not exist the output voltage input to directly read the input voltage and output voltage of the embedded latch relay to determine an open or closed state of the latch relay, thereby providing an effect capable of preventing the occurrence of an electrical safety accident according to a switching status error of the latch relay embedded in the electric power meter.

A controller for confirming the contact status of a latch relay embedded in an electric power meter according to the present disclosure may further include a voltage detection device connected to an input terminal and an output terminal of the embedded latch relay, respectively, thereby obtaining an effect capable of detecting the input voltage and output voltage of the embedded latch relay.

In a controller for confirming the contact status of a latch relay embedded in an electric power meter according to the present disclosure, the voltage detection device may be configured with a voltage dividing resistor connected to an input terminal and an output terminal of the embedded latch relay, respectively, to install the voltage dividing resistor at the input terminal and output terminal of the embedded latch relay, respectively, thereby obtaining an effect capable of detecting the voltage of the input terminal and output terminal of the embedded latch relay with a simple configuration and cost.

In a controller for confirming the contact status of a latch relay embedded in an electric power meter according to the present disclosure, the voltage detection device may be configured with a potential transformer connected to an input terminal and an output terminal of the embedded latch relay, respectively, to install the potential transformer at the input terminal and output terminal of the embedded latch relay, respectively, thereby obtaining an effect capable of detecting the voltage of the input terminal and output terminal of the embedded latch relay with a simple configuration.

What is claimed is:

1. A controller for confirming a contact status of a latch relay embedded in an electric power meter, comprising:
   a microcomputer unit that is electrically connected to the latch relay for reading and providing a contact switching status information of the latch relay to store when a power failure occurs, and read the contact switching status information stored during the power failure when a power recovers, and configured to output an opening control signal to the latch relay when the read contact switching status is an open state, and configured to output a closing control signal to the latch relay when the read contact switching status is a closed state; and a non-volatile memory that stores the contact switching status information of the latch relay provided by the microcomputer unit or provides the contact switching status information of the latch relay to the microcomputer unit during the power failure.

2. The controller of claim 1, wherein the microcomputer unit is configured to output the opening control signal to the latch relay when the read contact switching status information is the open state, and configured to output the closing control signal to the latch relay when the read contact switching status information is the closed state according to the contact switching status information read from the non-volatile memory during the power failure.

3. The controller of claim 1, wherein the microcomputer unit is configured to sense an input voltage and an output voltage of the embedded latch relay when the power recovers or in a state that the electric power meter is separated from a normal installation location and then reinstalled and an electric power is supplied again to the electric power meter, configured to determine the contact of the embedded latch relay as the closed state when the sensed input voltage of the embedded latch relay is substantially the same as the output voltage thereof, and configured to determine the contact of the embedded latch relay as the open state when there exists the input voltage input but does not exist the output voltage input.

4. The controller of claim 3, wherein the microcomputer unit is configured to output the opening control signal to the latch relay when the sensed contact switching status information represents the open state, and outputs the closing control signal to the latch relay when the sensed contact switching status information represents the closed state according to the sensed contact switching status information.

5. The controller of claim 3, further comprising a voltage detection device connected to an input terminal and an output terminal of the embedded latch relay, respectively, to detect the input voltage and output voltage of the embedded latch relay.

6. The controller of claim 5, wherein the voltage detection device is configured with a voltage dividing resistor connected to the input terminal and the output terminal of the embedded latch relay, respectively.

7. The controller of claim 5, wherein the voltage detection device is configured with a potential transformer connected to the input terminal and the output terminal of the embedded latch relay, respectively.

* * * * *